United States Patent [19]

Martel et al.

[11] 4,207,525
[45] Jun. 10, 1980

[54] CARRIER CONTROL SYSTEM FOR SUPPRESSED CARRIER MODULATORS

[75] Inventors: Robert J. Martel, Baltimore; Walter Ewanus, Ellicott City, both of Md.

[73] Assignee: Westinghouse Electric Corp., Pittsburgh, Pa.

[21] Appl. No.: 768,131

[22] Filed: Feb. 14, 1977

Related U.S. Application Data

[63] Continuation of Ser. No. 600,823, Dec. 12, 1966, abandoned.

[51] Int. Cl.² ............................................. H04B 1/68
[52] U.S. Cl. ...................................... 455/109; 332/44
[58] Field of Search .................... 325/138, 329, 163; 331/9; 332/44; 324/84; 333/11

[56] References Cited

U.S. PATENT DOCUMENTS

| | | | |
|---|---|---|---|
| 2,833,992 | 5/1958 | McKay | 332/44 |
| 3,136,950 | 6/1964 | Mackey | 332/44 |
| 3,221,251 | 11/1965 | Margerum et al. | 324/84 |
| 3,396,340 | 8/1968 | Black et al. | 325/138 |

*Primary Examiner*—Robert L. Richardson
*Assistant Examiner*—Tommy P. Chin
*Attorney, Agent, or Firm*—R. M. Trepp

[57] ABSTRACT

A suppressed carrier radio signaling system is described in which there is a servo loop utilizing balanced circuit techniques and using the carrier as the reference, in which a phase detector (or coherent demodulator) constantly senses the phase difference between the carrier source and the carrier component in the output signal to derive an error signal which is used to vary the amount of the carrier component toward zero.

8 Claims, 6 Drawing Figures

CARRIER CONTROL SYSTEM FOR SUPPRESSED CARRIER MODULATORS

GOVERNMENT CONTRACT

The invention herein described was made in the course of or under a contract or subcontract thereunder with the Department of the Air Force.

This is a continuation of application Ser. No. 600,823, filed Dec. 12, 1966, now abandoned.

This invention relates to an automatic system for controlling the carrier in a radio signaling system and more particularly to a carrier-nulling servo loop for minimizing the amplitude of the carrier radiated in such systems.

Suppressed carrier systems are well known in the art. Although the term "suppressed carrier" is used to describe the systems, such systems rely on balanced circuit techniques which are theoretically supposed to cancel the carrier. It is obvious that in such a system in any event that the system does not remain completely balanced some component of the carrier will be propagated.

The contemplation of a use of a suppressed carrier type of signal structure immediately raises the question regarding the degree to which the carrier can be reliably suppressed below the amplitude of modulation sidebands. Furthermore, the question also arises as to how well this suppression can be maintained as a function of environmental extremes. These requirements will vary from system to system depending upon the particular use for which the equipment is intended. For many systems, the carrier suppression problem is a fundamental one and a very important consideration. Merely by way of example, in considering an anti-jam phase-reversal-keyed (PRK), pseudo-random noise communication system with an anti-jam ratio of 30 db, it is mandatory that the amplitude of the carrier be suppressed by a ratio greater than 30 db. Actually, 40 db is a more reasonable system specification. In fact, as wideband techniques become further developed, it is anticipated that requirements for higher anti-jam ratios, and thus higher carrier suppression ratios, will become a standard requirement.

With the present state of the art, it is extremely difficult, if not impossible, to realize and maintain carrier suppression ratios in excess of 40 or 50 db, even using sophisticated balanced modulator techniques with precision components and matched temperature compensated diodes. The present invention provides an automatic carrier suppression control servo loop in a signaling system capable of providing suppression ratios of greater than 70 db over a very wide temperature range using conventional nonprecision components.

Accordingly, the primary object of the present invention is to provide a novel and improved control system for controlling the amount of carrier that is radiated in a so-called carrier suppression radio signaling system.

Another object is to provide a novel and improved carrier suppression system in which the amplitude of the carrier can be suppressed far below the amplitude of the modulation sideband over a wide temperature range without requiring the use of any nonconventional components.

Other and further objects will become apparent from the following description taken in connection with the accompanying drawings, in which.

Generally speaking, the present invention provides an automatic carrier suppression control servo loop using the carrier source as the reference that constantly monitors the phase difference between the carrier source and the carrier component in the signal output and constantly supplies a correction signal to a suppressed carrier balanced modulator between the carrier source and the output to control the level of the carrier component in the output. The output of the modulator plus a linear gain element, that is, an RF amplifier, provides the "power controlled variable". The output from the RF amplifier contains the phase and amplitude information of the undesired carrier component which is sufficient to establish a discriminator function. With these elements, namely, the carrier source and the balanced modulator, synchronous demodulation can be performed by the conventional phase detector that establishes an error signal which is used to control the amount of the carrier component in the output. The novelty in the present system, namely, resides in the concept of utilizing phase and amplitude information of the undesired carrier component in the radiated signal to establish a discriminator-like function, the amplitude and phase variation of which can be measured by a conventional phase detector that establishes an error signal which is used to control the amount of the carrier component in the output. Due to negative feedback this carrier component is suppressed to a degree determined by the loop gain which is achieved through conventional high gain operational amplifiers. Bandwidth shaping networks may also be utilized in the conventional sense through the use of operational amplifier feedback networks.

Figure 1:
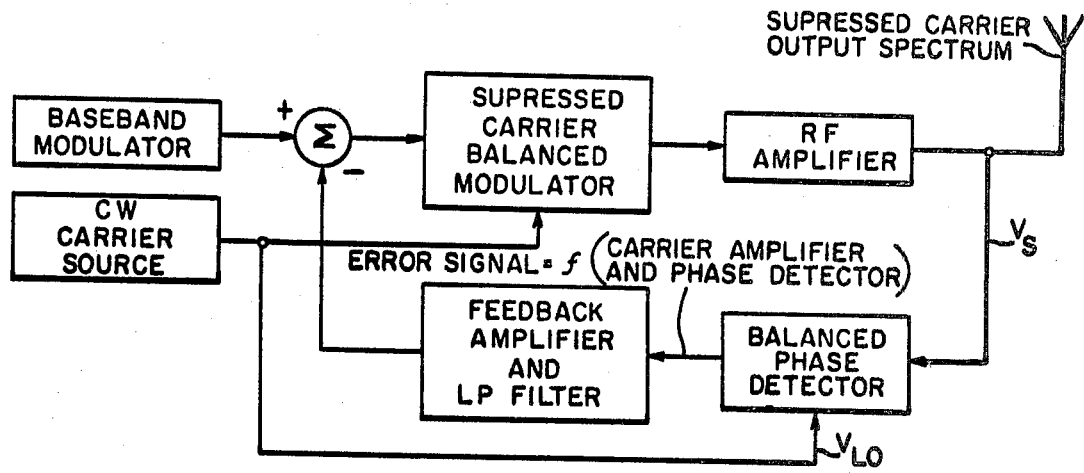
FIG. 1 is a block circuit diagram of the system in accordance with the present invention.
Figure 2:
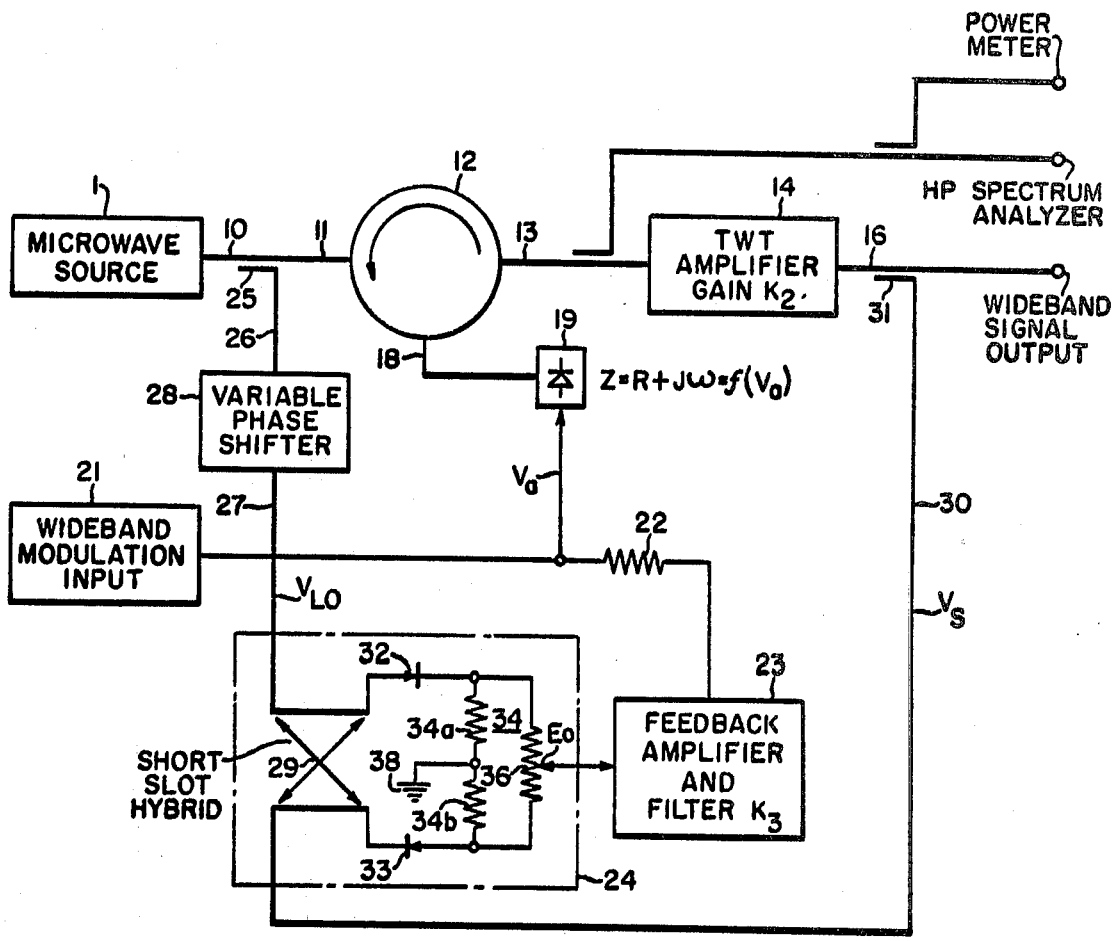
FIG. 2 is a circuit diagram, partially in block form, similar to FIG. 1 in which the balanced phase detector is shown in further detail.

Referring now to the illustration of the present invention shown in FIG. 2, a source of carrier frequency 1 is coupled through a section of waveguide 10 to an input arm 11 of a conventional balanced-modulator 12 in the form of a circulator. One output arm 13 from the balanced circulator-modulator is connected to an RF power amplifier 14, the output of which is supplied though a suitable microwave guide section 16 to output terminals, such as an antenna.

In addition to the arms 11 and 13, the circulator-modulator 12 also has arm 18 through which modulation signals are supplied to the modulator. Across the arm 18 there is connected a diode 19 through which the modulation signals are superimposed upon the carrier signal. The diode 19 also serves as the variable impedance control element for the carrier-nulling servo loop. The arm 18 may be of any length, open or closed.

The diode 19 acts as a variable impedance across the arm 18 and responds to the source of modulation signals 21 to cause a modulated RF output to be delivered from the RF amplifier 14 and the output 16. The diode 19 responds to the direct current bias supplied across it by means of a current limiting resistor 22 from the output of a feedback amplifier 23, the input of which is connected to the output of a phase detector 24. The phase detector is adapted to sense the phase difference between the carrier signals at the source 1 and the carrier component in the output of the system at 16. To this end, the carrier source 1 is connected through a directional coupler 25, waveguide sections 26 and 27 and a variable phase shifter 28 to one side of a short slot hybrid 29 while the output 16 is connected through the directional coupler 31 and microwave guide 30 to the other input side of the hybrid tee 29.

The hybrid tee 29 is a component of the phase detector 24, which also includes diodes 32, 33 and voltage divider 34 made up of resistors 34a and 34b and a second potential divider 36. Looking at the configuration of the phase detector, it can be considered that it constitutes a Wheatstone bridge balanced to ground 38 through one path including one-half of the resistor 36, one diode 32 and resistor 34a and the other path including the other half of the resistor 36, diode 33 and the resistor 34b. One input side of the slotted hybrid 29, such as the waveguide 27, is coupled through the diode 32 to the junction between the resistor 34a and one end of the resistor 36 while the other side of the hybrid is connected through the diode 33 to the junction point between the resistor 34b and the other half of resistor 36.

Figure 3:
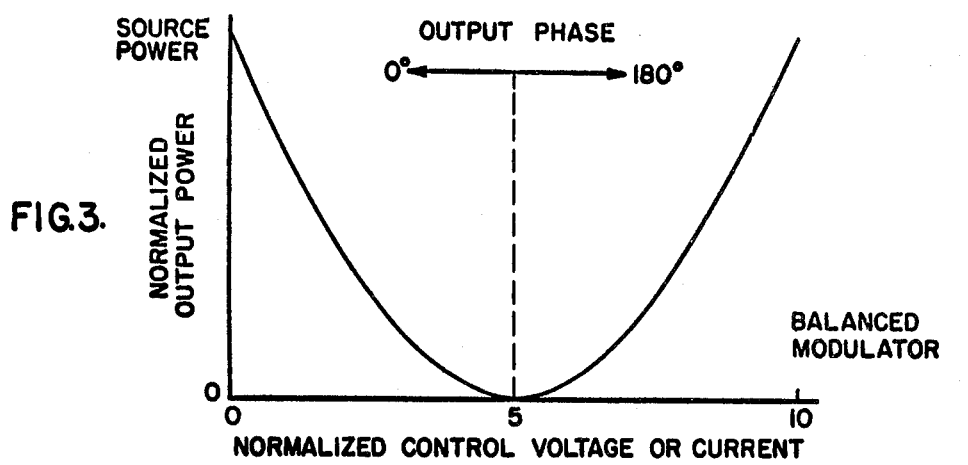
FIGS. 3, 4 and 5 are graphs presented for the purpose of facilitating the description of the system.
Figure 4:
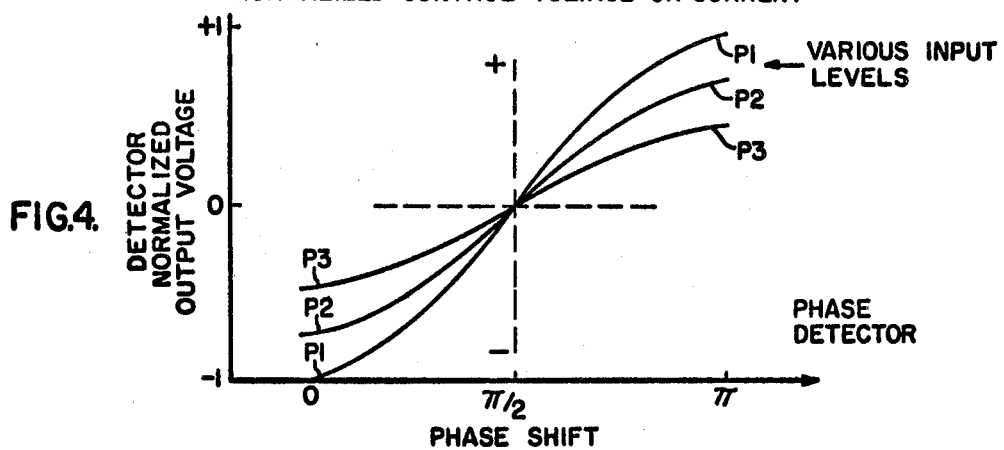
Figure 5:
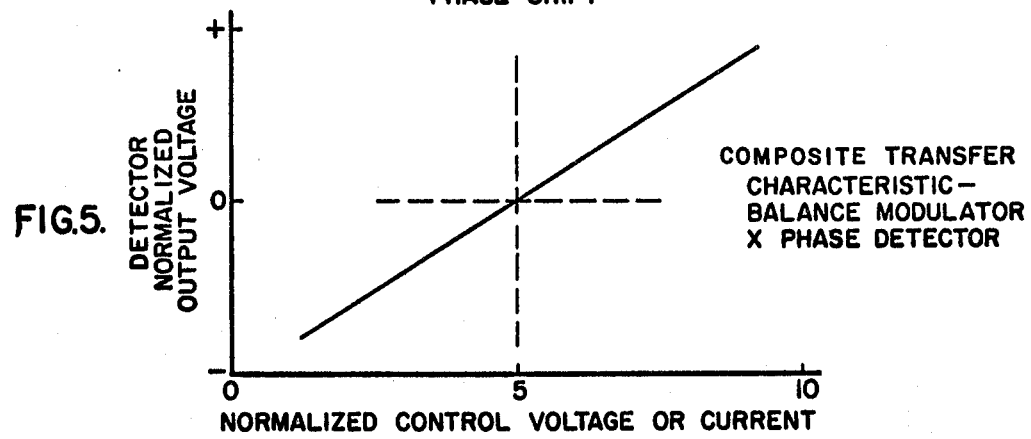
Figure 6:
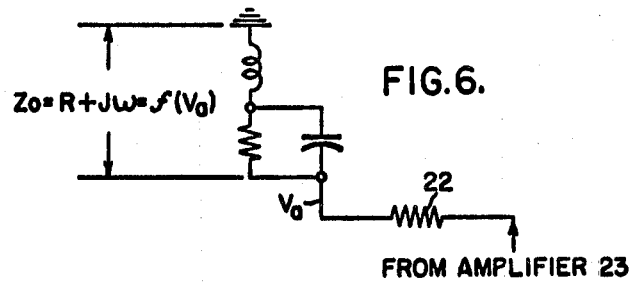
FIG. 6 is a diagram of an equivalent circuit of the modulation and servo loop control diode connected across one arm of the circulator modulator.

The operation of the carrier-nulling loop can best be understood by referring to the equivalent circuit diagram of FIG. 6 and the graphs of FIGS. 3, 4 and 5. The signal input to the phase detector 24 has a peak value of voltage $V_S$, coming from the output 16, at a phase angle Q radians relative to the peak value of the voltage $V_{LO}$ from the carrier source 1 in the waveguide 27, it being remembered that $V_{LO}$ is used as the reference voltage. It can be shown mathematically that phase detector transfer function K for small phase angles $\theta$ is $$K = E_o/\theta = M\sqrt{P_S P_{LO}} \quad (1)$$

where $P_S$ and $P_{LO}$ are the input signal power at 29 and the reference source input 27, respectively; M is a constant of proportionality and $E_o$ is the voltage appearing at the null point on the divider 36. The voltage $E_o$ is that which is applied to the input of the feedback amplifier 23 and therefore the voltage $V_a$ supplied to the diode 19 is $$V_a = K_3 E_o \quad (2)$$

where $K_3$ is the gain of amplifier 23. It should be pointed out here that the relationship of Equation (1) holds only if $$P_{LO} >> P_S \quad (3)$$

so that the sensitivity of diode 19 will be constant independently of the input signal power level.

Referring again to the graphs of FIGS. 3 to 5, inclusive, it will be recognized that the transfer characteristic of a balanced modulator is characterized by the fact that a 180° phase reversal of the RF voltage takes place as the carrier power goes through a zero, or null point. This is indicated in FIG. 3. Looking at FIG. 4, it will be recognized that the balanced phase detector is simply a phase sensitive amplitude detector so that on multiplying the transfer characteristics of the modulator, indicated in FIG. 3, by the phase detector characteristic indicated in FIG. 4, the composite characteristic in the form of a straight sloping line will be obtained, as indicated in FIG. 5. The net result therefore is that an error signal will be developed for which the amplitude is a linear function of the carrier amplitude and where the phase of the carrier is resolved by the polarity of the error voltage.

Referring again to FIG. 2, in the light of the previous description of operation it will be apparent that the control voltage $V_a$ supplied through the current limiting resistor 22 to the diode 19 changes the impedance (FIG. 6) across the arm 18 of the modulator 12 by such amount and in such a direction as to always drive the residual carrier component appearing at the output 16 toward the null.

An X-band version of the carrier nulling system in accordance with this invention operating at a center frequency of 10 GC has been built and tested. In that system suppressed carrier binary digit phase modulation was produced by changing the RF impedance of a Philco L4120 diode as the diode 19 of the circuit of FIG. 2. This type of modulator had a transfer characteristic of the type indicated in FIG. 3. A balanced phase detector was implemented by using a 3 db hybrid sidewall coupler with two 1N23C type crystals corresponding to diodes 32 and 33, as detectors. The most significant feature of the carrier-nulling system was that at room temperature it was possible to maintain the level of suppressed carrier at from 80 to 90 db below the unmodulated input carrier amplitude. However, also with a temperature variation of from −5° C. to +70° C., this ratio could still be maintained at a level greater than 65 db below the unmodulated carrier amplitude.

Although in the embodiment of the present invention, which was reduced to practice, binary digital phase modulation was utilized, it is desired to point out however that this system is not limited to any particular type of modulation. It can be used in connection with continuous modulation signals as well as pulse signals or a combination of the two.

Since carrier rejection could be achieved without affecting modulation sidebands, the device described herein acts as an extremely narrow band filter. For example, X-band tests of the device indicated a bandwidth approaching one cycle which is to say that the "Q" of the circuit is approximately equal to the carrier frequency at $10^{10}$ cycles per second. It should also be pointed out that, if the reference frequency is chosen to be any other frequency, that frequency will be rejected as if an almost perfect filter has been inserted in the line. Thus, it is possible that the present system is capable of filtering undesired frequencies in systems which could have spurious signals that are very difficult to remove without disturbing the remaining pass band characteristic of the filter.

We claim as our invention:

1. In a radio signaling system having a source of carrier frequency and a balanced modulator between said source and the system output, a carrier-nulling system for minimizing the carrier frequency component in the output of said system comprising: a phase detector coupled to said source of carrier frequency and to said system output for deriving from the carrier frequency from said source and from said system output an error signal in terms of a DC voltage for controlling said modulator to cause said modulator to drive the carrier frequency component in the output from said modulator toward a null.

2. A signalling system as set forth in claim 1, further including a source of modulating signals coupled to said modulator for modulating said carrier and wherein said carrier-nulling system includes a carrier-nulling servo loop for minimizing the carrier frequency component in said system output from said modulator comprising said phase detector for deriving said DC error voltage.

3. In a radio signaling system having a source of carrier frequency and a balanced modulator between said source and the system output, a carrier-nulling system for minimizing the carrier frequency component in the output of said system comprising: a phase detector coupled to said source of carrier frequency and to said system output for deriving from the carrier frequency from said source and from said system output an error signal for controlling said modulator to cause said modulator to drive the carrier frequency component in the output from said modulator toward a null.

4. A signaling system as set forth in claim 3, further including a source of modulating signals coupled to said modulator for modulating said carrier and wherein said carrier-nulling system includes a carrier-nulling servo loop for minimizing the carrier frequency component in said system output from said modulator comprising said phase detector for deriving said error signal.

5. A radio signaling system having a source of carrier frequency, a balanced modulator coupled between said source of carrier frequency and the system output, a source of modulating signals coupled to said modulator for modulating said carrier frequency, a carrier nulling servo loop for minimizing the carrier component in said system output comprising a balanced phase detector for deriving from the carrier frequency from said source and from said system output an error signal in terms of a DC voltage for controlling said modulator to cause said modulator to drive the carrier component in said system output toward a null, and means for supplying carrier frequency signals from said carrier source and from said system output to said phase detector so that the amplitude of said DC voltage is a monotonic function of the amplitude of said carrier component and the phase of said carrier component is resolved by the polarity of said DC voltage.

6. A radio signaling system comprising a source of microwave carrier signals, a source of modulating signals coupled to a diode, a balanced microwave circulator modulator having a first arm coupled to said source of carrier signals, a second arm coupled to the output, and a third arm coupled to said diode for supplying modulation signals to said third arm, a balanced phase detector having one input connected to said source of carrier signals and a second input connected to the output arm of said circulator; and means connecting the output of said phase detector to said diode to apply a bias on said diode responsive to the relative phase displacement between the signals from said carrier source and a carrier signal component in said output arm of said circulator.

7. A signaling system as set forth in claim 6 in which said phase detector comprises a short slot hybrid and said source of carrier signals is coupled to one input of said hybrid through a directional coupler and the output from said circulator is coupled to the other input of said hybrid through a second directional coupler.

8. A radio signaling system having a source of carrier frequency, a balanced modulator coupled between said source of carrier frequency and the system output, a source of modulating signals coupled to said modulator for modulating said carrier frequency, a carrier nulling servo loop for minimizing the carrier component in said system output comprising a balanced phase detector for deriving from the carrier frequency from said source and from said system output an error signal for controlling said modulator to cause said modulator to drive the carrier component in said system output toward a null, and means for supplying carrier frequency signals from said carrier source and from said system output to said phase detector so that the amplitude of said error signal is a monotonic function of the amplitude of said carrier component and the phase of said carrier component is resolved by the polarity of said error signal.

* * * * *